(12) United States Patent
Pon et al.

(10) Patent No.: US 12,347,784 B2
(45) Date of Patent: Jul. 1, 2025

(54) INTERPOSER WITH STEP FEATURE

(71) Applicant: Intel Corporation, Santa Clara, CA (US)

(72) Inventors: Florence Pon, Folsom, CA (US); Yi Xu, Folsom, CA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 967 days.

(21) Appl. No.: 16/365,811

(22) Filed: Mar. 27, 2019

(65) Prior Publication Data

US 2020/0312769 A1 Oct. 1, 2020

(51) Int. Cl.
| | | |
|---|---|---|
| *H01L 23/00* | (2006.01) | |
| *H01L 21/48* | (2006.01) | |
| *H01L 23/538* | (2006.01) | |
| *H01L 25/00* | (2006.01) | |
| *H01L 25/065* | (2023.01) | |

(52) U.S. Cl.
CPC ........ *H01L 23/5386* (2013.01); *H01L 21/486* (2013.01); *H01L 23/5384* (2013.01); *H01L 25/0657* (2013.01); *H01L 25/50* (2013.01); H01L 2225/06548 (2013.01); H01L 2225/06562 (2013.01)

(58) Field of Classification Search
CPC .............. H01L 23/5386; H01L 21/486; H01L 23/5384; H01L 25/0657; H01L 25/50; H01L 2225/06548; H01L 2225/06562
See application file for complete search history.

(56) References Cited

U.S. PATENT DOCUMENTS

| | | | | |
|---|---|---|---|---|
| 5,239,447 A | * | 8/1993 | Cotues | H01L 25/0652 |
| | | | | 438/117 |
| 10,312,221 B1 | * | 6/2019 | Agarwal | H01L 23/49811 |
| 2009/0134528 A1 | * | 5/2009 | Lee | H01L 24/19 |
| | | | | 257/E23.141 |
| 2010/0193930 A1 | * | 8/2010 | Lee | H01L 24/24 |
| | | | | 257/E23.173 |
| 2013/0241057 A1 | * | 9/2013 | Yu | H01L 25/0657 |
| | | | | 257/737 |
| 2015/0255427 A1 | * | 9/2015 | Sung | H01L 23/5383 |
| | | | | 257/737 |

* cited by examiner

*Primary Examiner* — Trang Q Tran
(74) *Attorney, Agent, or Firm* — Haley Guiliano LLP (57) ABSTRACT

Embodiments of the present disclosure may generally relate to systems, apparatus, and/or processes directed to an interposer with step features used to electrically couple stacked dies. In embodiments, the step features may appear as a ziggurat shape to one or more sides of the interposer, which may be referred to as a ziggurat interposer. The interposer may have electrical routing disposed within to electrically couple the first face of the one of the step features with a die.

14 Claims, 6 Drawing Sheets

INTERPOSER WITH STEP FEATURE

FIELD

Embodiments of the present disclosure generally relate to the field of package assemblies, and in particular package assemblies with stacked dies.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size system in package components.

DETAILED DESCRIPTION

Embodiments of the present disclosure may generally relate to systems, apparatus, and/or processes directed to an interposer with step features used to electrically couple stacked dies. In embodiments, the step features will appear as a ziggurat shape to one or more sides of the interposer, which may be referred to as a ziggurat interposer. For example, embodiments of the interposer may include a first side, a second side adjacent to and substantially perpendicular to a plane of the first side, where the second side includes a plurality of step features that include: a first face in a plane substantially parallel to the plane of the first side, a second face with a plane substantially perpendicular to the plane of the first face, and where the first face and the second face meet to form a step feature, and where the first face of one of the step features is to couple with a die. The interposer may have electrical routing disposed in the apparatus to electrically couple the first face of the one of the step features with the die.

In embodiments, a ziggurat interposer may facilitate high density, high performance stack package interconnections. It may include an array of large copper vias that are created on silicon wafers. These vias may have a standard via pitch that may be based on a typical silicon pad pitch to facilitate die stacking in a stair-stepped configuration. As a result, a ziggurat silicon interposer may be a flexible and reliable solution to provide lower cost for high performance, high density, high stack components.

Packages that are implemented with a stair-stepped die configuration using a ziggurat interposer have the advantage of shorter die to die connections as compared to legacy implementations, particularly when large die stacks are used. Legacy implementations may use a standard gold or copper wire package, that may be outside the stacked dies, to electrically connect the stacked dies. Other legacy implementations may use through silicon via (TSV) technology to provide electrical connections to each die that passes through all of the stacked dies.

Legacy wire bond implementations using gold may have difficulty meeting performance, signal integrity, and power delivery parameters for larger die stacks. Legacy wire bond implementations using copper to require a forming gas with higher cost, and 50% higher bonding force/power that may cause higher risk for pad damage and underlying circuitry near and/or directly beneath the pads (pad cratering). This may result incircuitry damage, in particular for packages that include 3D NAND and 3D-X point silicon. In addition, wires may be exposed or inadvertently cut by laser marking if too close to the top of the mold. Legacy TSV connections for stacked dies that requires one or more TSV in each die will result in a 20-30% increased silicon die area to accommodate the space needed for vias.

Embodiments described herein may use a combination of legacy implementations in conjunction with an interposer using step features such as a ziggurat shaped interposer.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

Figure 1:
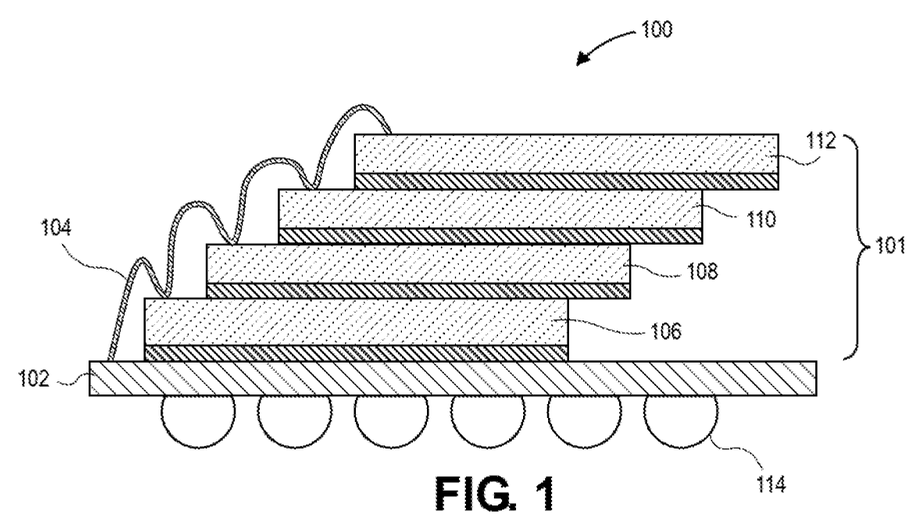
FIG. 1 illustrates an example of a package assembly using a wire connector to electrically couple a stack of dies, in accordance with embodiments.

FIG. 1 illustrates an example of a package assembly using a wire connector to electrically couple a stack of dies, in accordance with embodiments. Diagram 100 shows a die stack 101 that includes multiple stacked dies 106, 108, 110, 112 that are connected to a package substrate 102 that may include a ball grid array 114 to couple with a printed circuit board (PCB) or some other component (not shown). The die stack 101 is overlapping and forming a stair-stepped configuration.

In embodiments, a wire 104 may electrically couple the dies 106, 108, 110, 112 to each other, and to the substrate 102. In embodiments, the wire 104, in non-limiting examples, may be a gold wire, a copper wire, or other alloyed type wire provides a flexible wire bonding solution that connects each die down the die stack 101 to the package substrate 102. Although this implementation works well for shorter die stacks, as the die stack 101 increases in height and number of die stack, the wire 104 may not be able to handle the power requirements because of its length and the small diameter of wire.

In addition, if the wire 104 is made of gold, although assembly may be more reliable because it is a non-oxidizing metal that easily bonds to other material, gold has a higher resistance it may not be able to reliably meet performance marks for signal integrity and power delivery. If the wire 104 is made of copper, although it has lower resistance and is a good conductor, in mass production the copper bond requires a forming gas such as nitrogen +5% hydrogen to displace oxygen during manufacture because copper oxidizes readily. Additionally, copper is a harder metal and requires a higher force during manufacture. For example, depending upon the construction of silicon bond pads, the manufacturing process could break the design mechanically due to the risk for damage underneath the bondpad such as pad cratering.

Figure 2:
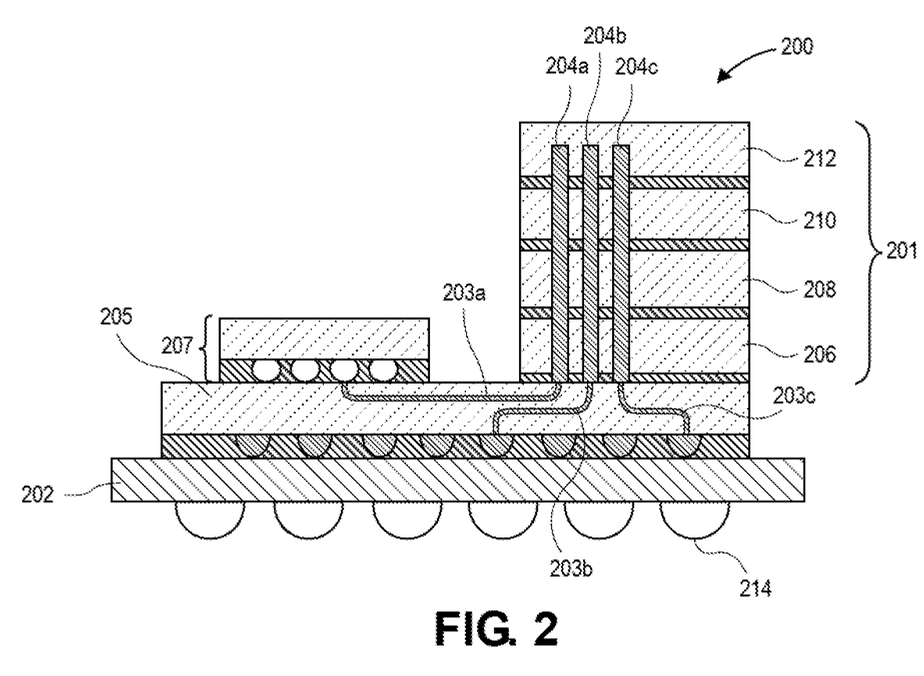
FIG. 2 illustrates an example of a package assembly using a via to electrically couple a stack of dies, in accordance with embodiments.

FIG. 2 illustrates an example of a package assembly using a via to electrically couple a stack of dies, in accordance with embodiments. Diagram 200 shows a die stack 201 that includes dies 206, 208, 210, 212 that are vertically stacked. The dies 206, 208, 210, 212 may be electrically coupled by copper-filled through silicon vias (TSV) 204a, 204b, 204c. This die-on-die chip attach implementation may achieve high I/O density with short transmission lines within a die stack 201.

In embodiments, the die stack 201 maybe coupled with a interposer 205 that made couple with another die 207 outside of the die stack 201. In embodiments, the interposer 205 may be required to fan out the silicon input/output (I/O) to adjust for the gap between the silicon I/O pitch to the substrate I/O pitch, for example using wires 203a, 203b, 203c to fan out from the TSVs 204a, 204b, 204c to the other die 207 and to the PCB 202. In embodiments, the interposer 205 may be coupled to a package substrate 202 that may include a BGA 214.

This implementation of package 200 that uses TSVs 204a, 204b, 204c to connect the die stack 201 has the disadvantage of being a high-cost implementation. It requires integration into a live die and has an increased cost in silicon design, process, and/or material selection, and may result in at least 30-50% increased wafer costs, where 30% may be due to the die size increase and the additional percentage to cover the manufacturing and material costs of TSVs 204a, 204b, 204c.

Figure 3:
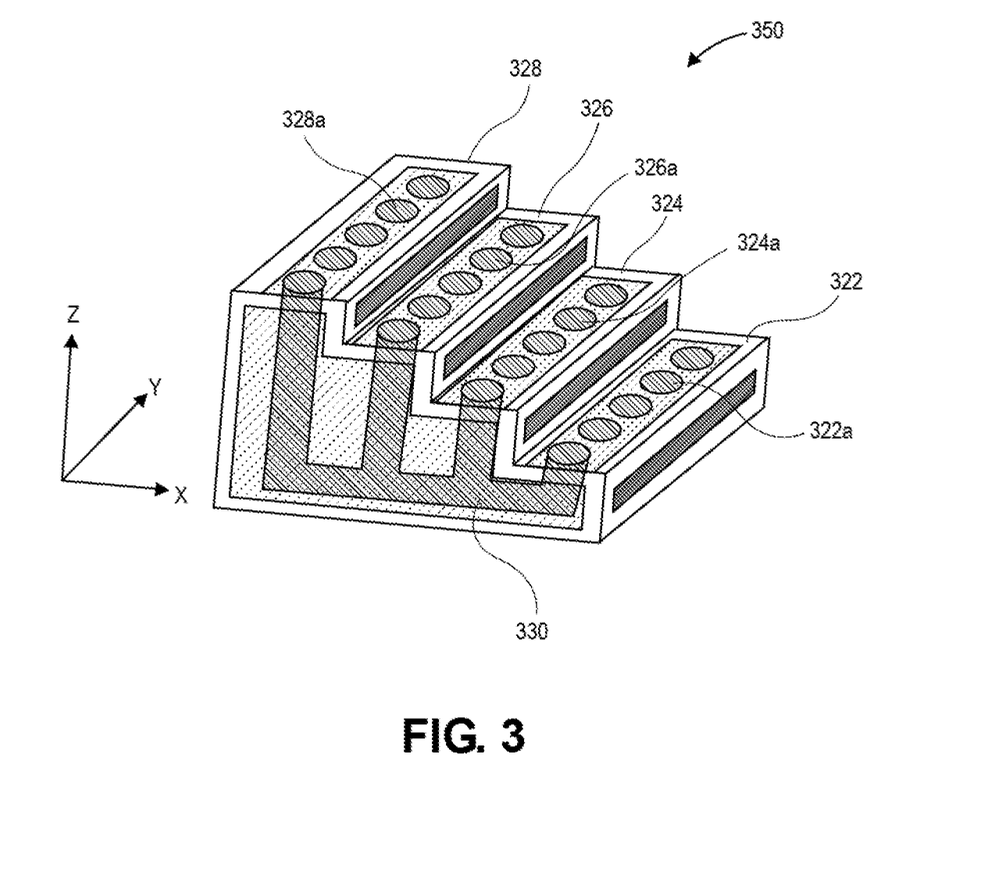
FIG. 3 illustrates an example of a ziggurat interposer, in accordance with embodiments.

FIG. 3 illustrates an example of a ziggurat interposer, in accordance with embodiments. Diagram 350 shows a ziggurat interposer that has four levels 322, 324, 326, 328 with each one or more electrical connectors 322a, 324a, 326a, 328a used to electrically couple with stair stepped stack of dies (not shown) described further below. In embodiments, the electrical connectors 322a, 324a, 326a, 328a may be constructed of vias filled with copper or some other conductive metal or alloy.

Electrical routings 330 within the interposer 350 electrically couple the various electrical connectors 322a, 324a, 326a, 328a as appropriate to the architecture of the die stack, for example stack 101 of FIG. 1. The electrical routings 330 may also electrically couple to PCBs, substrates, or other components (not shown) to provide voltages, a ground, or other signals to the various electrical connectors 322a, 324a, 326a, 328a. In embodiments, the electrical connectors 322a, 324a, 326a, 328a may take the form of pads, of sockets, or of any other suitable electrical connection that may be used to electrically couple to a die (not shown).

Figure 4:
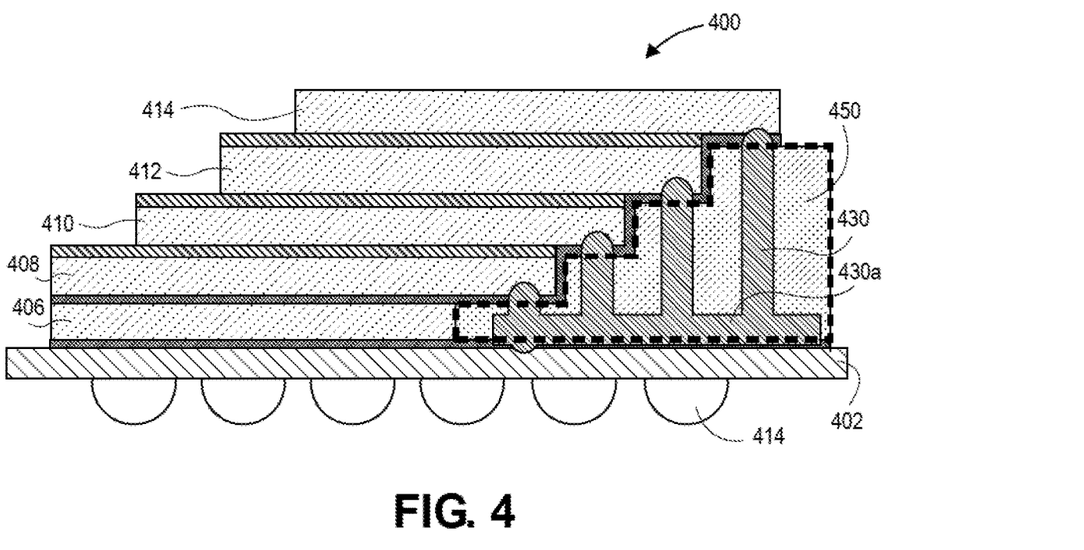
FIG. 4 illustrates an example of a ziggurat interposer coupled to a stack of dies, in accordance with embodiments.
Figure 5:
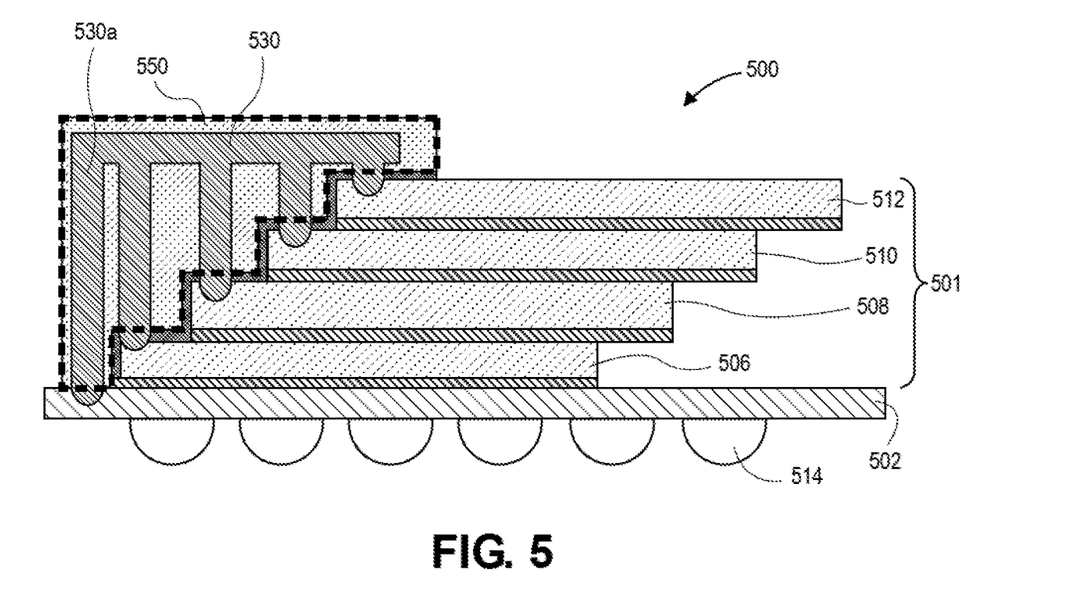
FIG. 5 illustrates another example of a ziggurat interposer coupled to a stack of dies, in accordance with embodiments.
Figure 6:
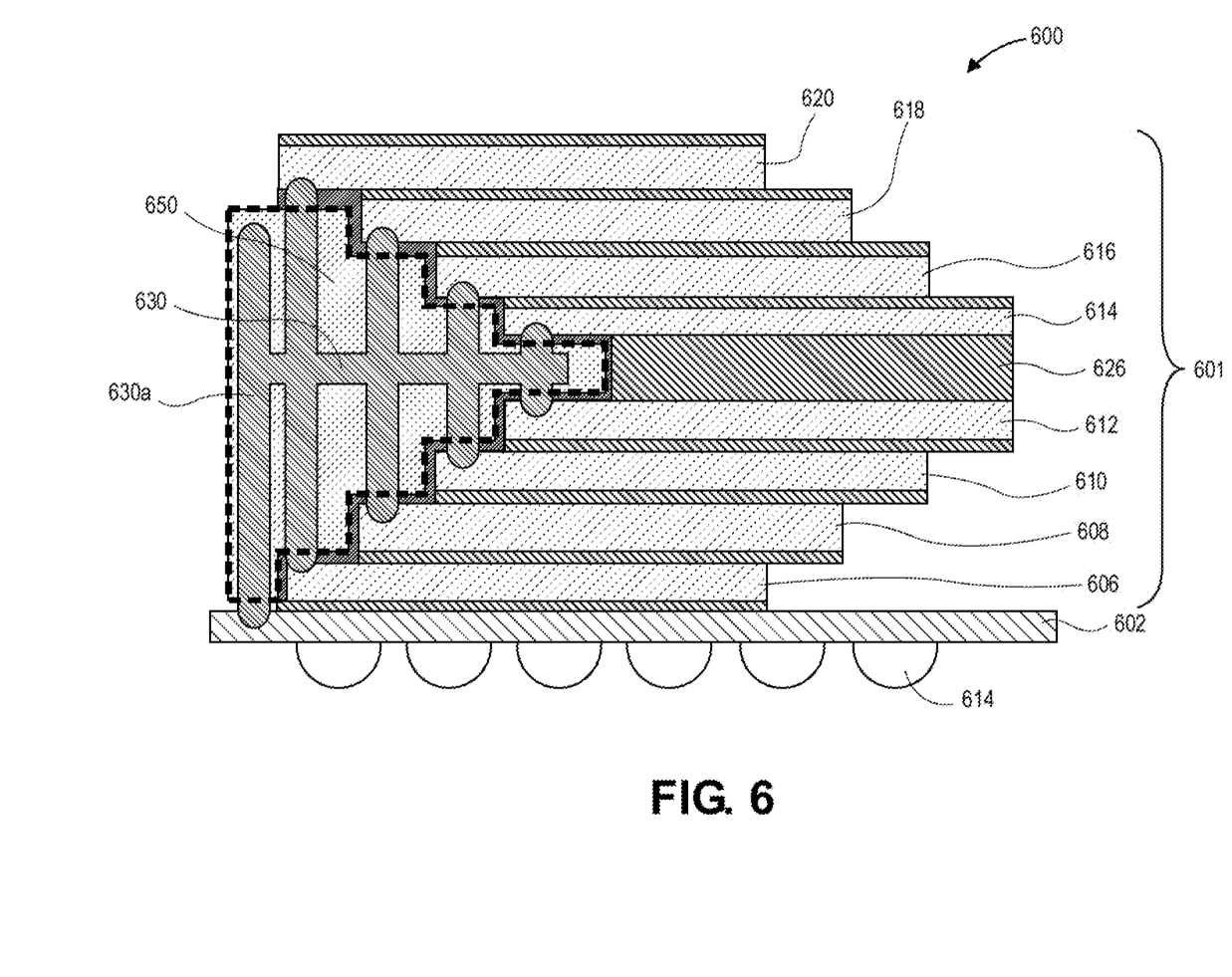
FIG. 6 illustrates another example of a ziggurat interposer coupled to a stack of dies, in accordance with embodiments

In embodiments, there may be more or less than four levels 322, 324, 326, 328, for example, 2, 3, 8, 10, 12, 16, or any other number as required by the design of a package using techniques as shown in FIGS. 4-6. In embodiments, the heights of each level 322, 324, 326, 328 may vary depending upon the height of the die (not shown) that may be coupled with the level. In embodiments, a blank, or spacer die, that may not contain any electrical circuitry may be attached to a level for structural support or for thermal routing within the package.

In embodiments, the interposer 350 may be made of silicon. In embodiments, the interposer 350 may be constructed using layers of silicon each with TSV or other electrical routings drilled or otherwise created within a silicon layer. In embodiments, these drilled layers may be combined. The ziggurat interposer may then be thinned to a target thickness and the steps, corresponding to levels 322, 324, 326, 328, may be made using a wafer saw by applying different feeding gaps in the Z direction. A mechanical or laser saw may be used. In embodiments, the ziggurat interposer may be sawed to the appropriate target die stack. In embodiments, a method to form the ziggurat interposer 350 may use through silicon vias on a single wafer to create uniform via heights, for example via 328a, and then use a laser or other mechanism to ablate the material and create the stepped heights for vias 326a, 324a, 322a.

FIG. 4 illustrates an example of a ziggurat interposer coupled to a stack of dies, in accordance with embodiments. Diagram 400 shows a ziggurat interposer 450 (surrounded by dashed lines), which may be similar to ziggurat interposer 300 of FIG. 3, that is coupled to the bottom edge of multiple dies 408, 410, 412, 414. In embodiments, a spacer 406, which may be a layer of silicon or an active die coupled with the package substrate 402, may be placed adjacent to the ziggurat interposer 450. One or more electrical routings 430 may couple with a die 408, 410, 412, 414 and may also couple with a bus 430a within the ziggurat interposer 450 that is electrically coupled to a substrate 402.

The bus 430a may connect with the voltage source, a ground, or some other source of signal generation. In embodiments, the substrate 402 may couple to a PCB or other component (not shown) using a BGA 414. In other embodiments (not shown), the electrical routings 430 may connect to a side edge of a die 408, 410, 412, 414.

Diagram 400 shows a ziggurat silicon interposer 450 on bottom with live die stack 408, 410, 412, 414 circuitry facing interposer. Exposed copper vias 430 may connect the silicon bond pads of the dies and the package substrate through gold ball or solder ball (not shown) which may be pre-planted on live silicon. This may be referred to as a wafer level ball drop. Top silicon backside of the dies 408, 410, 412, 414 may be exposed for better thermal dissipation. In embodiments, a two-sided copper expose/reveal may be used to connect the interposer 450 to the substrate 402.

FIG. 5 illustrates another example of a ziggurat interposer coupled to a stack of dies, in accordance with embodiments. Diagram 500 shows a ziggurat interposer 550 (surrounded by dashed lines), which may be similar to ziggurat interposer 300 of FIG. 3, that is electrically coupled to dies 506, 508, 510, 512. In embodiments, the electrical routing 530 may couple with the dies 506, 508, 510, 512, and may couple with a bus 530a that may electrically couple to package substrate 502. In embodiments, the package substrate 502 may electrically couple to a PCB or other component via a ball grid array 514.

Note that in diagram 500, the die stack 501 overhangs the package substrate 502, creating space between dies 508, 510, 512 and the package substrate 502. In embodiments, a spacer in a ziggurat shape (not shown) may be placed above the package substrate 502 to provide structural support for the dies 508, 510, 512. In embodiments, this spacer may be silicon or some other suitable filler material.

Diagram 500 shows a shingle stack live silicon die stack 501 attached first with the ziggurat silicon interposer 550 attached subsequently to accomplish the die to die, die to substrate 502 connections. In embodiments, exposed copper vias connect to live silicon bond pads through gold balls or solder balls which are pre-planted on live silicon, for example through a wafer level ball drop. In embodiments, this may result in a thinner package Z height implementation. For example, ball drop would result in a slightly taller implementation than solder plated copper pillars. There are two ways to prepare for the electrical and physical connections. First, the ziggurat interposer could have the solder plate on the copper pillars or the ball drop. Second, the silicon die bond pads could have the gold balls, plated solder, ball drop, or printed solder.

FIG. 6 illustrates another example of a ziggurat interposer coupled to a stack of dies, in accordance with embodiments. Diagram 600 shows a double ziggurat interposer 650, (surrounded by dashed lines) with halves that may be similar to ziggurat interposer 300 of FIG. 3. The routings 630 within the ziggurat interposer 650 connect to dies 614, 616, 618, 620 coupled to a first side of the interposer 650 as well as to dies 606, 608, 610 and 612 coupled to a second side of the interposer 650. The routings 630 may be electrically coupled to a bus 630a within the ziggurat interposer 650. This bus 630a may be electrically coupled to the package substrate 602. In embodiments, the package substrate 602 may be electrically coupled to a PCB or some other component (not shown) through a BGA 614 or through some other conductivity mechanism.

Spacer 626, which may be a filler layer, may provide structural support, thermal support, and/or alignment for the die stack 601. In embodiments, spacer 626 may be an active die that is electrically coupled with the ziggurat interposer 650. Diagram 600 shows a double sided ziggurat silicon interposer design 650 with two-side copper expose/reveal. This implementation results in a shortened connection from die to die with better conductivity with a copper via 630, 630a implementation instead of a legacy wire bond connection. This improves the electrical performance in package with a high die stack 601 using a cost efficient implementation.

Figure 7:
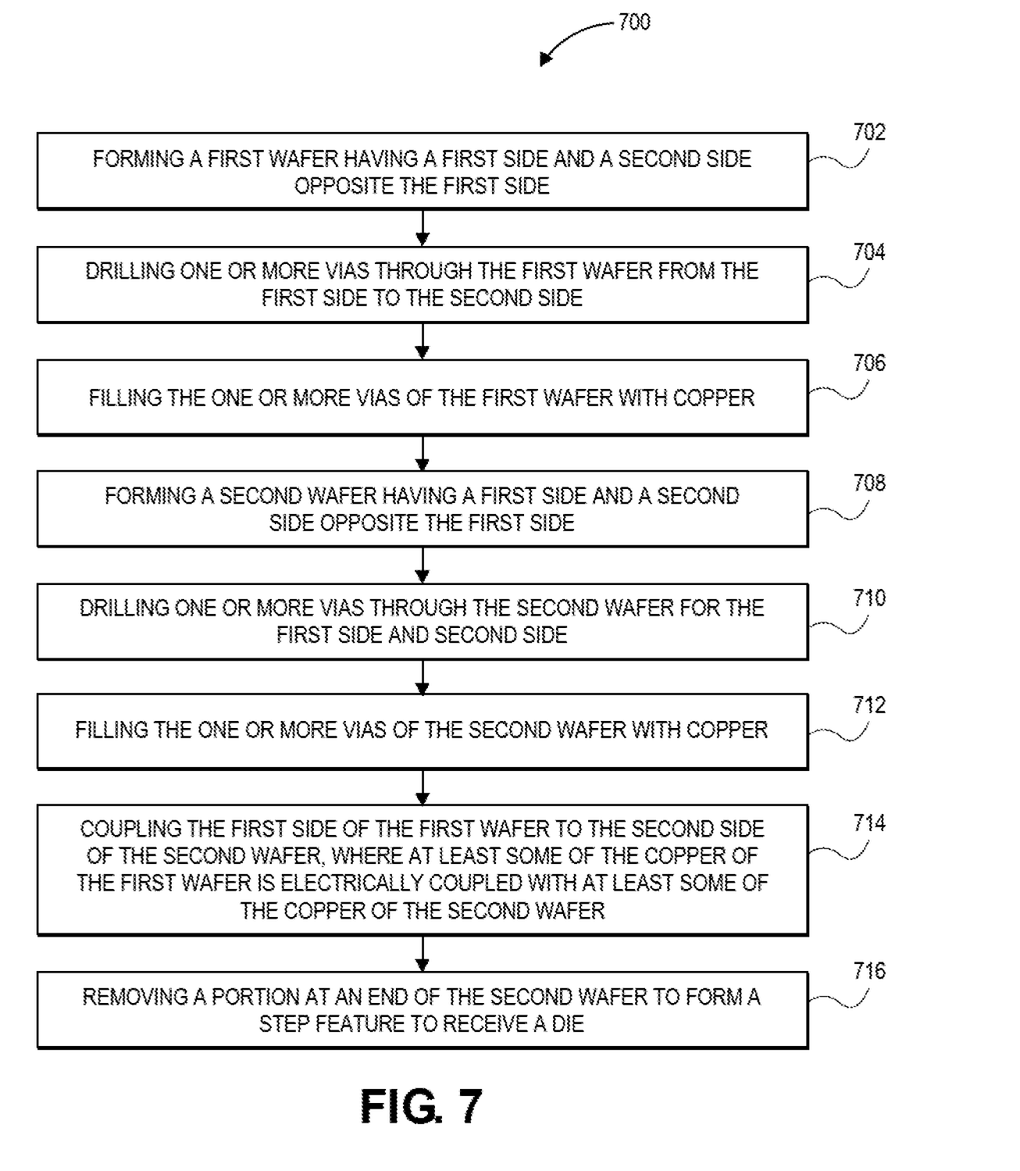
FIG. 7 illustrates an example of a process to create a ziggurat interposer, in accordance with embodiments.

FIG. 7 illustrates an example of a process to create a ziggurat interposer, in accordance with embodiments. Process 700 is related to the apparatus, structure, and techniques described with respect to FIGS. 1-6, and in particular to ziggurat interposers described with respect to interposer 350, 450, 550, and 650.

At block 702 the process may include forming a first wafer having a first side and a second side opposite the first side. In embodiments, this wafer may be a first layer of the ziggurat interposer 300 of FIG. 3. In embodiments, the first wafer may include silicon, a silicon compound, or some other suitable wafer material.

At block 704, the process may include drilling one or more vias through the first wafer from the first side to the second side. In embodiments, this may include machine drilling or laser drilling the vias in the first wafer.

At block 706, the process may further include filling the one or more vias of the first wafer with copper. In embodiments, another suitable material, such as gold, silver, or a metal or metallic alloy may be used.

At block 708, the process may further include forming a second wafer having a first side and a second side opposite the first side. In embodiments, the second wafer may form a second layer of the ziggurat interposer 300 of FIG. 3. In embodiments, the second wafer may include silicon, a silicon compound, or some other suitable wafer material.

At block 710, the process may further include drilling one or more vias through the second wafer for the first side and second side.

At block 712, the process may further include filling the one or more vias of the second wafer with copper. In embodiments, another suitable material, such as gold, silver, or a metal or metallic alloy may be used.

At block 714, the process may further include coupling the first side of the first wafer to the second side of the second wafer, where at least some of the copper of the first wafer is electrically coupled with at least some of the copper of the second wafer. In embodiments, this coupling may include mechanical coupling using adhesives. Coupling can also be done using TCNCP (thermal compression with non-conductive paste) or thermal compression bonding or mass reflow.

At block 716, the process may further include removing a portion at an end of the second wafer to form a step feature to receive a die. In embodiments, removing a portion at an end of the second wafer may include sawing the wafer using a mechanical or a laser saw, or thinning a Z direction of the portion of the wafer using a thinning mechanism.

Figure 8:
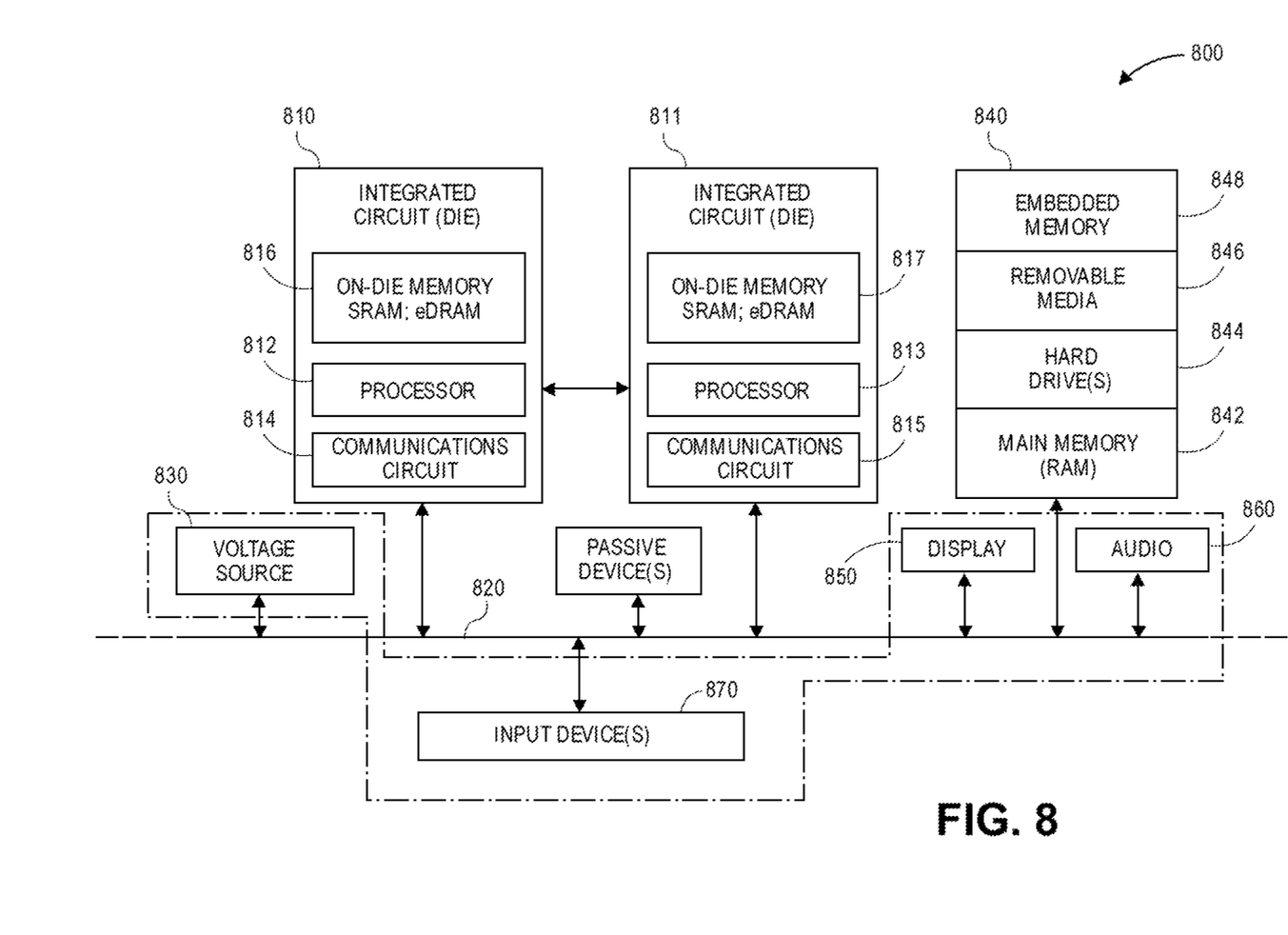
FIG. 8 schematically illustrates a computing device, in accordance with embodiments.

FIG. 8 schematically illustrates a computing device, in accordance with embodiments. The computer system 800 (also referred to as the electronic system 800) as depicted can embody an interposer with step features, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, magnetic cores cured using structures within a substrate layer, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having magnetic cores cured using structures within a substrate layer, according to any of the several disclosed embodiments and their equivalents, an electronic system, a computer system, one or more methods of fabricating an integrated circuit, and one or more methods of fabricating an electronic assembly that includes a package substrate having magnetic cores cured using structures within a substrate layer, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having magnetic cores cured using structures within a substrate layer embodiments and their equivalents. A foundation substrate may be included, as represented by the dashed line of FIG. 8. Passive devices may also be included, as is also depicted in FIG. 8.

EXAMPLES

Example 1 may be an interposer apparatus comprising: a first side; a second side adjacent to and substantially perpendicular to a plane of the first side, wherein the second side includes a plurality of step features that include: a first face in a plane substantially parallel to the plane of the first side, a second face with a plane substantially perpendicular to the plane of the first face, and wherein the first face and the second face meet to form a step feature; wherein the first face of one of the step features is to couple with a die; and electrical routing disposed in the apparatus to electrically couple the first face of the one of the step features with the die.

Example 2 may include the apparatus of example 1, wherein the first face includes one or more electrical connectors to electrically couple the die with the electrical routing.

Example 3 may include the apparatus of example 2, wherein the one or more electrical connectors include copper vias.

Example 4 may include the apparatus of example 2, wherein the electrical routing includes one or more copper vias.

Example 5 may include the apparatus of example 4, wherein the copper vias are in silicon wafers and have a standardized pitch.

Example 6 may include the apparatus of example 1, wherein the first side is a top side or a bottom side.

Example 7 may include the apparatus of example 1, wherein the first face and the second face identify a portion of a silicon wafer layer of the apparatus.

Example 8 may include the apparatus of example 1, wherein electrical routing includes a plurality of electrical routings to couple, respectively, with a plurality of electrical connectors of the die.

Example 9 may include the apparatus of example 1, wherein the electrical routing is to couple with a voltage source or a ground.

Example 10 may include the apparatus of any one of examples 1-9, wherein the plurality of step features form a ziggurat shape.

Example 11 may include the apparatus of any one of examples 1-9, wherein the one of the step features is a first step feature; and further comprising a second step feature, wherein first faces, respectively, of the first step feature and the second step feature couple with adjacent dies.

Example 12 may be a system, comprising: one or more dies; an interposer comprising: a first side; a second side adjacent to and substantially perpendicular to a plane of the first side, wherein the second side includes a plurality of step features that include: a first face in a plane substantially parallel to the plane of the first side, a second face with a plane substantially perpendicular to the plane of the first face, and wherein the first face and the second face meet to form a step feature; wherein the first face of one of the step features is to couple with a die; electrical routing disposed in the apparatus to electrically couple the first face of the one of the step features with the die; and wherein the plurality of step features form a ziggurat shape to the second side; and one or more dies electrically coupled, respectively, to the first face of one or more step features.

Example 13 may include the system of example 12, wherein electrical routing includes a plurality of electrical routings to couple, respectively, with a plurality of electrical connectors of the die.

Example 14 may include the system of example 13, wherein the plurality of electrical routings include one or more copper vias.

Example 15 may include the system of example 13, wherein the plurality of electrical routings are to couple with a voltage source or a ground.

Example 16 may include the system of any one of examples 13-15, further comprising a substrate, wherein the interposer is to electrically couple with the substrate.

Example 17 may be a method comprising: forming a first wafer having a first side and a second side opposite the first side; drilling one or more vias through the first wafer from the first side to the second side; filling the one or more vias of the first wafer with copper; forming a second wafer having a first side and a second side opposite the first side; drilling one or more vias through the second wafer for the first side and second side; filling the one or more vias of the second wafer with copper; coupling the first side of the first wafer to the second side of the second wafer, where at least some of the copper of the first wafer is electrically coupled with at least some of the copper of the second wafer; and removing a portion at an end of the second wafer to form a step feature to receive a die.

Example 18 may include the method of example 17, wherein removing a portion at the end of the second wafer further includes removing a portion at the end of the second wafer with a wafer saw.

Example 19 may include the method of example 17, wherein the wafer is a silicon wafer.

Example 20 may include the method of example 17, further comprising electrically coupling a die with the step feature.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An interposer apparatus comprising:
   a first side;
   a second side adjacent to and substantially perpendicular to a first plane of the first side, wherein the second side includes a plurality of step features that include: a first face in a second plane substantially parallel to the first plane of the first side, a second face with a third plane substantially perpendicular to the first plane of the first face, and wherein the first face and the second face meet to form a step feature;
   wherein the first face of a first step feature of the plurality of step features is to couple with a first die;
   wherein the first face of a second step feature of the plurality of step features is to couple with a second die;
   a first electrical connector to couple to the first die, the first electrical connector in the interposer apparatus;
   a second electrical connector to couple to the second die, the second electrical connector in the interposer apparatus; and
   electrical routing disposed in the interposer apparatus to electrically couple the first electrical connector directly to the second electrical connector within the interposer apparatus.

2. The interposer apparatus of claim 1, wherein the first and second electrical connectors include copper vias.

3. The interposer apparatus of claim 1, wherein the electrical routing includes one or more copper vias.

4. The interposer apparatus of claim 3, wherein the copper vias are in silicon.

5. The interposer apparatus of claim 1, wherein the first side is a top side or a bottom side.

6. The interposer apparatus of claim 1, wherein the first face and the second face identify a portion of a silicon layer of the apparatus.

7. The interposer apparatus of claim 1, wherein the electrical routing is to couple with a voltage source or a ground.

8. The interposer apparatus of claim 1, wherein the plurality of step features form a ziggurat shape.

9. A system, comprising:
   a first die and a second die;
   an interposer comprising:
   a first side;

a second side adjacent to and substantially perpendicular to a first plane of the first side, wherein the second side includes a plurality of step features that include: a first face in a second plane substantially parallel to the first plane of the first side, a second face with a third plane substantially perpendicular to the first plane of the first face, and wherein the first face and the second face meet to form a step feature;

wherein the first face of a first step feature of the plurality of step features is coupled to the first die;

wherein the first face of a second step feature of the plurality of step features is coupled to the second die;

a first electrical connector coupled to the first die, the first electrical connector in the interposer;

a second electrical connector coupled to the second die, the second electrical connector in the interposer; and electrical routing disposed in the apparatus and electrically coupling the first electrical connector directly to the second electrical connector within the apparatus; and wherein the plurality of step features form a ziggurat shape.

10. The system of claim 9, wherein the electrical routing includes one or more copper vias.

11. The system of claim 9, wherein the electrical routing is to couple with a voltage source or a ground.

12. The system of claim 9, further comprising a substrate, wherein the interposer is to electrically couple with the substrate.

13. An interposer apparatus comprising:

a first side;

a second side adjacent to and substantially perpendicular to a first plane of the first side, wherein the second side includes a plurality of step features that include: a first face in a second plane substantially parallel to the first plane of the first side, a second face with a third plane substantially perpendicular to the first plane of the first face, and wherein the first face and the second face meet to form a step feature;

wherein the first face of a first step feature of the plurality of step features is to couple with a first die;

wherein the first face of a second step feature of the plurality of step features is to couple with a second die;

a first electrical connector to couple to the first die, the first electrical connector in the interposer apparatus;

a second electrical connector to couple to the second die, the second electrical connector in the interposer apparatus; and electrical routing disposed in the interposer apparatus to electrically couple the first electrical connector directly to the second electrical connector within the interposer apparatus, wherein the electrical routing includes one or more copper vias, and wherein the copper vias are in silicon.

14. An interposer apparatus comprising:

a first side;

a second side adjacent to and substantially perpendicular to a first plane of the first side, wherein the second side includes a plurality of step features that include: a first face in a second plane substantially parallel to the first plane of the first side, a second face with a third plane substantially perpendicular to the first plane of the first face, and wherein the first face and the second face meet to form a step feature, wherein the first face and the second face identify a portion of a silicon layer of the apparatus;

wherein the first face of a first step feature of the plurality of step features is to couple with a first die;

wherein the first face of a second step feature of the plurality of step features is to couple with a second die;

a first electrical connector to couple to the first die, the first electrical connector in the interposer apparatus;

a second electrical connector to couple to the second die, the second electrical connector in the interposer apparatus; and electrical routing disposed in the interposer apparatus to electrically couple the first electrical connector directly to the second electrical connector within the interposer apparatus.

* * * * *